(12) United States Patent
Kim et al.

(10) Patent No.: US 9,349,778 B2
(45) Date of Patent: May 24, 2016

(54) POLYMER FILM, FLEXIBLE LIGHT EMITTING ELEMENT DISPLAY DEVICE, AND ROLLABLE DISPLAY DEVICE

(71) Applicant: LG CHEM, LTD., Seoul (KR)

(72) Inventors: Heon Kim, Daejeon (KR); Yeong Rae Chang, Daejeon (KR); Hye Min Kim, Daejeon (KR); Young Suk Kim, Daejeon (KR); Soon-Hwa Jung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/422,421

(22) PCT Filed: May 9, 2014

(86) PCT No.: PCT/KR2014/004164
§ 371 (c)(1),
(2) Date: Feb. 19, 2015

(87) PCT Pub. No.: WO2014/182127
PCT Pub. Date: Nov. 13, 2014

(65) Prior Publication Data
US 2015/0218323 A1    Aug. 6, 2015

(30) Foreign Application Priority Data

May 9, 2013    (KR) .................... 10-2013-0052701
May 8, 2014    (KR) .................... 10-2014-0054991

(51) Int. Cl.
*C09K 19/00*    (2006.01)
*H01L 27/32*    (2006.01)
(Continued)

(52) U.S. Cl.
CPC ............. *H01L 27/3244* (2013.01); *C08J 7/047* (2013.01); *H01L 51/0097* (2013.01);
(Continued)

(58) Field of Classification Search
CPC ............ H01L 51/0097; H01L 51/5253; H01L 51/5032; H01L 51/5036; H01L 51/5012; H01L 27/3244; C08J 5/18; C08J 2333/14; C08J 2333/08; C08J 2367/04; C08J 7/047; Y10T 428/10; Y10T 428/1086; Y10T 428/31786; Y10T 428/31855; C09D 105/16; C09D 167/04; C08G 83/007; C08B 37/0012; C08B 37/0015
USPC ......... 428/1.1, 1.6, 220, 480, 500; 525/54.23; 536/103
See application file for complete search history.

(56) References Cited

U.S. PATENT DOCUMENTS

2009/0042034 A1    2/2009    Ito et al.
2009/0214871 A1    8/2009    Fukuda et al.
(Continued)

FOREIGN PATENT DOCUMENTS

CN    101300302 A    11/2008
CN    101784568 A    7/2010
(Continued)

OTHER PUBLICATIONS

International Search Report issued in International Application No. PCT/KR2014/004164 on Aug. 27, 2014, 2 pages.
(Continued)

*Primary Examiner* — Ruiyun Zhang
(74) *Attorney, Agent, or Firm* — Rothwell, Figg, Ernst & Manbeck, P.C.

(57) ABSTRACT

The present invention relates to a polymer film containing a binder resin and polyrotaxane having a specific structure, and a flexible light emitting element display device and a rollable display device including the coating film.

25 Claims, 3 Drawing Sheets

(51) Int. Cl.
*H01L 51/52* (2006.01)
*H01L 51/00* (2006.01)
*C08J 7/04* (2006.01)

(52) U.S. Cl.
CPC ........ *H01L 51/5253* (2013.01); *C08J 2303/02* (2013.01); *C08J 2333/08* (2013.01); *C08J 2333/14* (2013.01); *C08J 2363/00* (2013.01); *C08J 2367/02* (2013.01); *C08J 2367/04* (2013.01); *C08J 2375/04* (2013.01); *C08J 2400/21* (2013.01); *H01L 2251/5338* (2013.01); *Y10T 428/10* (2015.01); *Y10T 428/1086* (2015.01)

(56) References Cited

U.S. PATENT DOCUMENTS

| | | | |
|---|---|---|---|
| 2011/0105688 A1 | 5/2011 | Ruslim et al. | |
| 2011/0124823 A1 | 5/2011 | Hayashi et al. | |
| 2014/0079937 A1* | 3/2014 | Jung et al. | 428/220 |

FOREIGN PATENT DOCUMENTS

| | | |
|---|---|---|
| EP | 2377904 A1 | 10/2011 |
| EP | 2787010 A1 | 10/2014 |
| JP | 2008-310286 A | 12/2008 |
| JP | 2010-138259 A | 6/2010 |
| JP | 2011-046917 A | 3/2011 |
| JP | 2011-178931 A | 9/2011 |
| KR | 10-2009-0118054 A | 11/2009 |
| KR | 10-2011-0058743 A | 6/2011 |
| KR | 10-2013-0008537 A | 1/2013 |
| KR | 10-1231292 B1 | 2/2013 |
| TW | 201410760 A | 3/2014 |
| WO | 2006090819 A1 | 8/2006 |
| WO | 2007100136 A1 | 9/2007 |
| WO | 2011/108514 A1 | 9/2011 |
| WO | 2012/165401 A1 | 12/2012 |
| WO | WO 2013176528 A1 * | 11/2013 |

OTHER PUBLICATIONS

Extended European Search Report issued in corresponding Application No. EP 14793988.8, dated Jun. 17, 2015, 5 pages.
Communication issued in European Patent Application No. 14793988.8 on Apr. 1, 2016, 9 pages.
P. Agarwal et al. "Calorimetric Studies in Glassy Se80-xTe20Inx", Phys. Stat. Sol. (a), vol. 127, No. 2, pp. 363-369.

* cited by examiner

POLYMER FILM, FLEXIBLE LIGHT EMITTING ELEMENT DISPLAY DEVICE, AND ROLLABLE DISPLAY DEVICE

CROSS REFERENCE TO RELATED APPLICATIONS

This application is a 35 U.S.C. §371 National Phase Entry Application from PCT/KR2014/004164, filed on May 9, 2014, and designating the United States, which claims priority under 35 U.S.C. §119 to Korean Patent Application No. 10-2013-0052701 filed on May 9, 2013 and to Korean Patent Application No. 10-2014-0054991 filed on May 8, 2014, which are incorporated herein by reference in their entireties.

FIELD OF THE INVENTION

The present invention relates to a polymer film, a flexible light emitting element display device, and a rollable display device, and more particularly, to a polymer film capable of having high elongation or elasticity together with mechanical properties such as excellent scratch resistance, chemical resistance, abrasion resistance, and the like, to thereby be applied to a flexible display device, a rollable display device, or the like, and a flexible light emitting element display device and a rollable display device using the same.

BACKGROUND OF THE INVENTION

A flexible display is a display capable of being warped, bent, or rolled without damage through a thin and flexible substrate, like paper. Since a plastic material, a plastic film, or the like is used as the substrate, this flexible display has advantages in that it is light and thin and is not broken even by impact. Therefore, application of the flexible display to a display for a mobile device has been considered. In addition, since the shape of the display may be changed, for example, the display may be bent, in the case in which application of the flexible display spreads to household items, the automotive field, or the like in the future, an explosive demand for the flexible display may be expected, such that a flexible display industry appears promising.

In order to decrease weight of a product, a plastic substrate is used in the flexible displays, but a bending degree is not sufficient or the plastic substrate is vulnerable to scratches, and in the case in which the bending degree is increased, the plastic substrate may be broken. Therefore, in a currently known flexible display, tempered glass or the like has been used as a cover window together with the plastic substrate.

In order to commercialize the flexible display in the true sense, the material of the flexible display should be replaced by a material having sufficient physical properties to replace the tempered glass, or the like. Particularly, in order to commercialize the flexible display in various fields such as for a portable display device and the like, the flexible display should not be broken by pressure or force applied from the outside but should be sufficiently able to be warped and folded.

Therefore, various researches on an external material of a flexible display or a rollable display capable of having high elasticity and protecting a product from being damaged by mechanical, physical, and chemical influence from the outside have been conducted.

DETAILED DESCRIPTION OF THE INVENTION

Technical Objectives

The present invention has been made in an effort to provide a polymer film capable of having high elongation or elasticity together with mechanical properties such as excellent scratch resistance, chemical resistance, abrasion resistance, and the like, to thereby be applied to a flexible display device, a rollable display device, or the like.

In addition, the present invention has been made in an effort to provide a flexible light emitting element display device using the polymer film.

Further, the present invention has been made in an effort to provide a rollable display device using the polymer film.

Technical Solutions

There is provided a polymer film including: a binder resin having a weight average molecular weight of 30,000 to 800,000; and polyrotaxane including a macrocycle to which a lactone-based compound is bonded, a linear molecule penetrating into the macrocycle, and a blocking group arranged at both ends of the linear molecule to prevent the macrocycle from being separated, wherein a rate of polyrotaxane in which an end of the lactone-based compound is substituted by a (meth)acrylate-based compound in the entire polyrotaxane is 40 mol % to 70 mol %, and the polymer film is bent over a mandrel having a diameter of 10ϕ or less without cracking in a mandrel test.

And, there is provided a flexible light emitting element display device including the polymer film.

In addition, there is provided a rollable display device including the polymer film.

Hereinafter, the polymer film, the flexible light emitting element display device, and the rollable display device according to exemplary embodiments of the present invention will be described in detail.

In the present specification, the term "(meth)acrylate" includes both an acrylate and a methacrylate.

According to an exemplary embodiment of the present invention, a polymer film including: a binder resin having a weight average molecular weight of 30,000 to 800,000; and polyrotaxane including a macrocycle to which a lactone-based compound is bonded, a linear molecule penetrating into the macrocycle, and a blocking group arranged at both ends of the linear molecule to prevent the macrocycle from being separated are provided, wherein a rate of polyrotaxane in which an end of the lactone-based compound is substituted by a (meth)acrylate-based compound in the entire polyrotaxane is 40 mol % to 70 mol %, and the polymer film is bent over a mandrel having a diameter of 10ϕ or less without cracking in a mandrel test.

The present inventors conducted research on a coating material, an interlayer material, a substrate material, and the like that are capable of being applied to a light emitting element display device, and confirmed through experiments that a polymer film prepared by mixing a polyrotaxane compound having a specific structure with a predetermined polymer binder resin has high elongation or elasticity together with mechanical properties such as excellent scratch resistance, chemical resistance, and abrasion resistance, or the like, to thereby be easily applied to a flexible or rollable display device, or the like, thereby completing the present invention.

Due to the properties as described above, the polymer film according to the exemplary embodiment may be used as a substrate, an external protective film, or a cover window in a light emitting element display device such as a liquid crystal display (LCD), a plasma display panel (PDP), an organic light emitting diode (OLED), or the like, or a rollable display device. In detail, the light emitting element display device may be a flexible organic light emitting diode (OLED) display, and in this OLED display device, the polymer film may be used as a cover window.

At the time of applying the polymer film to a mandrel test, the polymer film may be bent over a mandrel having a diameter of 10ϕ or less, 1ϕ to 8ϕ, or 3ϕ to 7ϕ without cracking. That is, the polymer film may have flexibility or elasticity so that the polymer film may be bent over a mandrel cylinder having a diameter value in a relatively low numerical range. The symbol "ϕ" means a unit of the diameter of the mandrel used in the mandrel test and has the same value as "millimeter".

In addition, the polymer film may have sufficient flexibility or elasticity to be bent over a cylindrical steel mandrel having a diameter of 7.0 mm or less, or 3.0 mm to 7.0 mm, without cracking at the time of performing measurement according to ASTM Standard D522-93A method B.

In addition, the polymer film according to the exemplary embodiment may have elongation of 5% to 500% at room temperature. The elongation of the polymer film means a degree to which the polymer film may be elongated when external pressure or external force is applied thereto at room temperature, and more specifically, the elongation may be measured according to the ASTM D638 method. Within the elongation range as described above, even though the polymer film is stretched and deformed by external pressure or force, physical or chemical properties may not be substantially changed. That is, the polymer film may have elasticity or flexibility of a degree to which the polymer film may not be broken by pressure or force applied from the outside but may be sufficiently warped and folded.

High elasticity or elongation, high flexibility, a foldable property, or a rollable property of the polymer film according to the exemplary embodiment may be obtained by using the polyrotaxane having the properties as described above together with the binder resin.

A thickness of the polymer film according to the exemplary embodiment may be determined depending on a final product to which the polymer film is applied or that uses of the polymer film, and in order to secure sufficient mechanical properties and implement high elasticity or elongation, high flexibility, and the foldable or rollable property, the polymer film may have a thickness of 5 μm to 100 μm.

The polymer film according the exemplary embodiment may have a glass transition temperature of –80° C. to 100° C. or –60° C. to 80° C.

Meanwhile, the polyrotaxane is a compound in which a dumbbell-shaped molecule and a macrocycle are structurally interposed, wherein the dumbbell-shaped molecule includes a predetermined linear molecule and a blocking group arranged at both ends of this linear molecule, the linear molecule penetrates into the macrocycle, the macrocycle may move along the linear molecule, and separation of the macrocycle may be prevented by the blocking group.

More preferably, the polyrotaxane may include a macrocycle to which a lactone-based compound having a (meth)acrylate-based compound introduced at an end is bonded, a linear molecule penetrating into the macrocycle, and a blocking group arranged at both ends of the linear molecule to prevent the macrocycle from being separated. That is, the polyrotaxane is characterized in that the lactone-based compound is bonded to the macrocycle, and the (meth)acrylate-based compound is bonded to the ends of the lactone-based compound bonded as described above. In addition, the rate of polyrotaxane in which the end of the lactone-based compound is substituted by the (meth)acrylate-based compound in the entire polyrotaxane may be 40 mol % to 70 mol %.

Particularly, the (meth)acrylate-based compound is bonded to the end of the macrocycle included in the polyrotaxane via the lactone-based compound, such that there is a double bond capable of being used in a crosslinking reaction or polymerization reaction. Therefore, in the polymer film, the polyrotaxane may form a predetermined crosslinked network structure, and the polymer film according to the exemplary embodiment may have a crosslinked structure between the binder resin and the polyrotaxane. Accordingly, the polymer film may have high elasticity or elongation, high flexibility, and the foldable or rollable property while securing the mechanical properties such as higher scratch resistance, chemical resistance, abrasion resistance, and the like.

The polyrotaxane compound is characterized in that the lactone-based compound is bonded to the macrocycle, and the (meth)acrylate-based compound is bonded to the end of the lactone-based compound bonded to the macrocycle at a rate of 40 mol % to 70 mol %. That is, the rate of the polyrotaxane in which the end of the lactone-based compound is substituted by the (meth)acrylate-based compound in the entire polyrotaxane may be 40 mol % to 70 mol %, preferably 45 mol % to 65 mol %.

When the rate of the polyrotaxane in which the end of the lactone-based compound is substituted by the (meth)acrylate-based compound in the entire polyrotaxane is less than 40 mol %, the polyrotaxane may not be sufficiently crosslinked with the binder resin, such that the polymer film according to the exemplary embodiment may not secure sufficient mechanical properties such as scratch resistance, chemical resistance, abrasion resistance, or the like. In addition, a hydroxyl functional group remaining at the ends of the lactone-based compound may be increased, such that a polarity of the polyrotaxane compound may be increased and compatibility with a non-polar solvent usable in a preparation process of the polymer film may be decreased, thereby deteriorating quality or appearance characteristics of a final product.

In addition, when the rate of the polyrotaxane in which the end of the lactone-based compound is substituted by the (meth)acrylate-based compound in the entire polyrotaxane is more than 70 mol %, the polyrotaxane may be excessively cross-linked with the binder resin, such that it may be difficult to secure sufficient elasticity or self-healing capability in the polymer film according to the exemplary embodiment, and a crosslinking degree of the coating material may be increased such that elasticity may be decreased [brittleness may be significantly increased]. Further, elongation, flexibility, and the foldable or rollable property of the polymer film according to the exemplary embodiment may be deteriorated.

An introduction or substitution rate of the (meth)acrylate-based compound may be measured from a rate of a residue of the lactone-based compound bonded to the macrocycle of the polyrotaxane compound and a residue of the (meth)acrylate-based compound. For example, the introduction rate or substitution rate may be calculated by comparing a number of moles or a nuclear magnetic resonance (NMR) peak intensity of a predetermined functional group (for example, —$CH_2$— at a specific position) included in the lactone-based compound with a number of moles or an NMR peak intensity of a predetermined functional group (for example, —$CH_2$— at a specific position) included in the (meth)acrylate-based compound.

Any macrocycle may be used without specific limitations as long as it has a sufficient size to penetrate into or surround the linear molecule, and the macrocycle may include a functional group such as a hydroxyl, an amino, a carboxyl, a thiol, or an aldehyde group that may react with other polymers or compounds. Specific examples of the macrocycle may include α-cyclodextrin, β-cyclodextrin, γ-cyclodextrin, and a mixture thereof.

The lactone-based compound bonded to the macrocycle may be directly bonded to the macrocycle or bonded to the macrocycle via a straight or branched oxyalkylene group having 1 to 10 carbon atoms. The functional group mediating this bond may be determined according to the kind of functional group substituted in the macrocycle or the lactone-based compound, or the kind of compound used in the reaction of the macrocycle and the lactone-based compound.

The lactone-based compound may include a lactone-based compound having 3 to 12 carbon atoms or a polylactone-based compound including a lactone-based repeating unit having 3 to 12 carbon atoms. Therefore, when the lactone-based compound is bonded to the macrocycle and the (meth)acrylate-based compound, the residue of the lactone-based compound in the polyrotaxane may include a functional group of the following Chemical Formula 1.

[Chemical Formula 1]

In Chemical Formula 1, m is an integer of 2 to 11, preferably an integer of 3 to 7, and n is an integer of 1 to 20, preferably an integer of 1 to 10.

The (meth)acrylate-based compound may be introduced at the end of the lactone-based compound bonded to the macrocycle. The "introduction" means a substituted or bonded state.

More specifically, the (meth)acrylate-based compound may be directly bonded to the end of the lactone-based compound or bonded to the lactone-based compound via a urethane bond (—NH—CO—O—), an ether bond (—O—), a thioester bond (—S—CO—O—), or an ester bond (—CO—O—). The kind of functional group mediating the bond between the (meth)acrylate-based compound and the lactone-based compound may be determined according to the kind of functional group substituted in each of the meth)acrylate-based compound and the lactone-based compound or the kind of compound used in the reaction of the meth)acrylate-based compound and the lactone-based compound.

For example, in the case of reacting a (meth)acrylate-based compound including at least one of an isocyanate group, a carboxylic group, a hydroxyl group, a thioate group, and a halogen group with the macrocycle to which the lactone-based compound is bonded, a direct bond, a urethane bond (—NH—CO—O—), an ether bond (—O—), a thioester bond (—S—CO—O—), or an ester bond (—CO—O—) may be formed. Further, in the case of reacting the reactant obtained by reacting a compound including at least two of an isocyanate group, a carboxylic group, a hydroxyl group, a thioate group, and a halogen group with the macrocycle to which the lactone-based compound is bonded with a (meth)acrylate-based compound including at least one of a hydroxyl group and a carboxylic group, at least one of a urethane bond (—NH—CO—O—), an ether bond (—O—), a thioester bond (—S—CO—O—), and an ester bond (—CO—O—) may be formed.

The (meth)acrylate-based compound may be a (meth)acryloyl alkyl compound, a (meth)acryloylcycloalkyl compound or a (meth)acryloylaryl compound, to which at least one of an isocyanate group, a carboxyl group, a thioate group, a hydroxyl group, and a halogen group is bonded at the end.

Herein, a straight or branched alkylene group having 1 to 12 carbon atoms may be included in the (meth)acryloylalkyl compound, a cycloalkylene group having 4 to 20 carbon atoms may be included in the (meth)acryloylcycloalkyl compound, and an arylene group having 6 to 20 carbon atoms may be included in the (meth)acryloylaryl compound.

Therefore, when the (meth)acrylate-based compound is bonded to the end of the lactone-based compound, in the polyrotaxane, the residue of the (meth)acrylate-based compound may include a functional group of the following Chemical Formula 2.

[Chemical Formula 2]

In Chemical Formula 2, $R_1$ may be hydrogen or methyl, and $R_2$ may be a straight or branched alkylene group having 1 to 12 carbon atoms, a cycloalkylene group having a 4 to 20 carbon atoms, or an arylene group having 6 to 20 carbon atoms. * means a binding site.

Meanwhile, as the linear molecule, any compound may be used without particular limitation as long as it has a molecular weight of a predetermined value or more and a straight chain shape, but it is preferable that a polyalkylene-based compound or a polylactone-based compound is used. More specifically, a polyalkylene-based compound having an oxyalkylene repeating unit having 1 to 8 carbon atoms or a polylactone-based compound having a lactone-based repeating unit having 3 to 10 carbon atoms may be used.

In addition, this linear molecule may have a weight average molecular weight of 1000 to 50,000. In the case in which the weight average molecular weight of the linear molecule is excessively small, the mechanical properties or self-healing capability of the polymer film prepared using the linear molecule may not be sufficient, and in the case in which the weight average molecular weight is excessively large, appearance characteristics of the prepared polymer film or uniformity of the material may be significantly deteriorated.

Meanwhile, the blocking group may be suitably adjusted according to properties of the prepared polyrotaxane. For example, one or at least two selected from a group consisting of a dinitrophenyl group, a cyclodextrin group, an adamantane group, a trityl group, a fluorescein group, and a pyrene group may be used.

The polyrotaxane having the specific structure as described above may have a weight average molecular weight of 100,000 to 800,000, preferably 200,000 to 700,000, and more preferably 350,000 to 650,000. In the case in which the weight average molecular weight of the polyrotaxane is excessively small, the mechanical properties or self-healing capability of the polymer film prepared using the polyrotaxane may not be sufficient, and in the case in which the weight average molecular weight is excessively large, appearance characteristics of the elastic polymer resin layer or uniformity of the material may be significantly deteriorated.

In addition, since the (meth)acrylate-based compound is introduced at the end of the macrocycle, the polyrotaxane may have a relatively low OH value. That is, in the case in which only a lactone-based compound is bonded to the macrocycle, a large number of hydroxyl (—OH) groups may exist in the polyrotaxane molecule, but as the (meth)acrylate-based compound is introduced at the end of this lactone-based compound, the OH value of the polyrotaxane may be decreased.

The polymer film may contain the polyrotaxane at a content of 1 to 50 wt %. In the case in which the content of the polyrotaxane in the polymer film is excessively small, it may be difficult to secure the above-mentioned physical properties of the polymer film. In the case in which the content of the polyrotaxane is excessively large, the mechanical properties of the polymer film may be rather deteriorated.

Meanwhile, the binder resin may include a polymer resin having mechanical properties, elasticity, and the like, at a predetermined level or more. In addition, the binder resin may have a weight average molecular weight of 30,000 to 800,000 or 50,000 to 500,000. When the binder resin has the above-mentioned weight average molecular weight, suitable mechanical properties and the above-mentioned properties may be secured.

In detail, the binder resin may include a (meth)acrylate-based polymer, a urethane (meth)acrylate-based polymer, a polyurethane resin, a silicone-epoxy copolymer of which a (meth)acrylate group is introduced at an end, a mixture of at least two thereof, or a copolymer of at least two thereof.

Other polymers except for the silicone-epoxy copolymer of which the (meth)acrylate group is introduced at the end may have a weight average molecular weight of 30,000 to 500,000.

Specific examples of the (meth)acrylate-based polymer may include acrylic (meth)acrylate, epoxy (meth)acrylate, polyester (meth)acrylate, polyether (meth)acrylate, and polysiloxane (meth)acrylate.

Specific example of the urethane meth)acrylate-based polymer may include polyester urethane (meth)acrylate, polyether urethane (meth)acrylate, caprolactone urethane (meth)acrylate, polybutadiene urethane (meth)acrylate, siloxane urethane (meth)acrylate, and polycarbonate urethane (meth)acrylate.

An example of the polyurethane resin may include polyester-based polyurethane, polyether-based polyurethane, or the like.

In the silicone-epoxy copolymer of which the (meth)acrylate group is introduced at the end, a silicone component may allow the elastic polymer resin layer to have high elasticity and elongation, and an epoxy component may allow the elastic polymer resin layer to have mechanical properties such as high chemical resistance, scratch resistance, abrasion resistance, and the like.

In general, a silicone component or epoxy compound has high flexibility and thermal stability, but the silicon component or the epoxy compound itself does not have sufficient mechanical properties. In addition, an epoxy component has excellent mechanical strength and chemical resistance, but flexibility thereof is not sufficient such that a curing time may be long, and it is difficult to independently cure the epoxy component. In addition, since compatibility between the silicone component and the epoxy component is not good, when the silicone component and the epoxy component are physically mixed with each other and then coated, each component may not be uniformly mixed in the formed coating layer but may be phase-separated, and optical properties of the film may be significantly deteriorated.

On the contrary, the silicone-epoxy copolymer of which the (meth)acrylate group is introduced at the end may implement properties of each of the silicon component and the epoxy component and secure a synergic effect over a simple mixing effect as a single component in which the silicon component and the epoxy component are copolymerized, as compared to the case in which the silicon component and the epoxy component are simply physically mixed.

In addition, since in the silicone-epoxy copolymer, the (meth)acrylate group is introduced at the end thereof, at the time of irradiating ultraviolet (UV) rays, the silicone-epoxy copolymer may be chemically bonded to another acrylate-based binder resin, such that excellent mechanical properties and the self-healing capability may be implemented.

The silicone-epoxy copolymer of which the (meth)acrylate group is introduced at the end may contain silicone at a content of 5 wt % to 50 wt %. In the case in which the content of the silicone component is less than 5 wt %, it is difficult to secure sufficient flexibility and elasticity in the polymer film. Further, in the case in which the content of the silicone component is more than 50 wt %, physical properties of the elastic polymer resin layer may be rather deteriorated, or external optical properties may be deteriorated.

A weight average molecular weight of the silicone-epoxy copolymer of which the (meth)acrylate group is introduced at the end may be 1000 to 30,000. In the case in which the weight average molecular weight of the silicone-epoxy copolymer is less than 1000, it may be difficult to sufficiently secure elasticity or flexibility and mechanical properties of the polymer film. Further, in the case in which weight average molecular weight of the silicone-epoxy copolymer is more than 30,000, the physical properties of the polymer film may be rather deteriorated, or the external optical properties may be deteriorated.

Meanwhile, the silicone-epoxy copolymer of which the (meth)acrylate group is introduced at the end may be a polymer including a repeating unit of the following Chemical Formula 3 and a repeating unit of the following Chemical Formula 4.

[Chemical Formula 3]

In Chemical Formula 3, n is an integer of 1 to 150.

[Chemical Formula 4]

In Chemical Formula 4, R1 and R2 may be the same or different, and are each independently hydrogen, a methyl group, or an ethyl group.

The polymer film according to the exemplary embodiment may have a crosslinked structure between the binder resin and the polyrotaxane. As described below, the polymer film may be formed from a resin composition containing the binder resin and polyrotaxane, and while the resin composition is subjected to a thermal curing process, a photocuring process, or both of the thermal curing process and the photo-curing process, the crosslinked structure may be formed between the binder resin and the polyrotaxane.

The polymer film may contain a multifunctional acrylate-based compound forming a crosslink bond with at least one of the binder resin and the polyrotaxane. The multifunctional acrylate-based compound is a functional acrylate-based compound having two or more functional groups, and may be additionally contained in the resin composition containing the binder resin and polyrotaxane. In addition, while the resin composition is subjected to the thermal curing process, the photocuring process, or both of the thermal curing process and the photocuring process, the multifunctional acrylate-based compound may be crosslinked with at least one or both of the binder resin and the polyrotaxane. A specific example of the multifunctional acrylate-based compound is described below.

Meanwhile, the polymer film may be formed from the resin composition containing the binder resin and polyrotaxane. The polymer film may be formed by applying and curing the resin composition on a predetermined substrate. The resin composition may contain the binder resin itself or a precursor of the binder resin, for example, a monomer or oligomer forming the binder resin.

A method and apparatus that are generally used to apply the resin composition may be used without particular limitations. For example, a Meyer bar coating method, an applicator coating method, a roll coating method, or the like, may be used.

The resin composition containing the binder resin and polyrotaxane may have a thermal curable property, a photocurable property, or both of the thermal-curable property and the photocurable property.

In the case in which the resin composition is thermally curable, the resin composition may contain a thermal initiator, and may selectively further contain a thermal curable monomer. The thermal curable monomer may include a monomer compound including at least one of reactive functional groups capable of performing a crosslinking reaction or polymerization reaction when heat is applied to the resin composition. Examples of the reactive functional group may include a carbon-carbon double bond, a (meth)acrylate group, a hydroxyl group, an oxide group, and the like.

In the case of thermally curing the resin composition, a thermal curing temperature and time may be determined according to the kind of binder resin used. For example, a temperature of 25° C. to 200° C. may be applied.

Meanwhile, in the case in which the resin composition is photocurable, the resin composition may contain a photoinitiator, and may selectively further contain a photocurable monomer.

As the photoinitiator, any compound may be used without particular limitation as long as it is known that the compound is generally used in the art. For example, a benzophenone-based compound, an acetophenone-based compound, a biimidazole-based compound, a triazine-based compound, an oxime-based compound, or a mixture thereof may be used. Specific examples of the photoinitiator may include benzophenone, benzoyl methyl benzoate, acetophenone, 2,4-diethyl thioxanthone, 2-chloro thioxanthone, ethyl anthraquinone, 1-hydroxy-cyclohexyl-phenyl-ketone (as a commercially available product, Irgacure 184 (Ciba Company)), 2-hydroxy-2-methyl-1-phenyl-propan-1-one, or the like may be used.

The photocurable monomer may form a crosslink structure with the binder resin when the resin composition is cured by UV irradiation, such that a network crosslink structure may be more densely formed. In addition, as the photocurable monomer is used, workability of the resin composition may be further improved, and the mechanical properties and the self-healing capability of the prepared polymer film may be further improved.

The photocurable monomer may contain a multifunctional acrylate-based compound having two or more functional groups. Specific examples of this photo-crosslinker may include pentaerythritol tri/tetraacrylate (PETA), dipentaerythritol hexa-acrylate (DPHA), trimethylolpropane triacrylate (TMPTA), ethylene glycol diacrylate (EGDA), hexamethylene diacrylate (HDDA), or a mixture thereof.

In a process of UV curing the resin composition, UV or visible rays having a wavelength of 200 nm to 400 nm may be irradiated, and at the time of irradiation, a preferable exposure amount may be 100 mJ/cm$^2$ to 4000 mJ/cm$^2$. An exposure time is not particularly limited, but may be suitably changed according to the exposure apparatus used, a wavelength of the irradiated rays, or the exposure amount.

The resin composition may contain an organic solvent. As the organic solvent, any organic solvent may be used without particular limitations as long as it is known that the organic solvent may be used in a coating composition. For example, a ketone-based organic solvent such as methyl isobutyl ketone, methyl ethyl ketone, dimethyl ketone, and the like; an organic alcohol solvent such as isopropyl alcohol, isobutyl alcohol, normal butyl alcohol, and the like; an acetate organic solvent such as ethyl acetate, normal butyl acetate, and the like; and a cellusolve organic solvent such as ethyl cellusolve, butyl cellusolve, and the like may be used, but the organic solvent is not limited thereto.

As the above-mentioned resin composition contains other components such as the photoinitiator, the thermal initiator, the thermal curable monomer, the photocurable monomer, and the organic solvent, residues of other components may be contained in the polymer film.

Contents of the residues of other components may be determined according to amounts used in the resin composition. The photoinitiator or thermal initiator may be contained in the polymer film at a content of about 0.001 wt % to 1 wt %. The thermal curable or photocurable monomer may be contained in the polymer film at a content of 0.01 wt % to 20 wt %. The polymer film may contain the remainder binder resin excluding the other components and the polyrotaxane.

According to another exemplary embodiment of the present invention, a flexible light emitting element display device including the polymer film according to the exemplary embodiment may be provided.

In the light emitting element display device, the polymer film according to the exemplary embodiment may be used as a substrate, an external protective film, or a cover window. In detail, the light emitting element display device may be an organic light emitting diode (OLED) display using the polymer film according to the exemplary embodiment as a cover window. The light emitting element display device may include an equipment part known as a constituent component of a general organic light emitting diode (OLED) display except that the polymer film is used as the cover window.

For example, in the organic light emitting diode (OLED) display, a cover window including the polymer film may be positioned on an outer portion in a direction in which light or an image is emitted, and a cathode providing electrons, an electron transport layer, an emission layer, a hole transport layer, and an anode providing holes may be sequentially formed.

Further, the organic light emitting diode (OLED) display may further include a hole injection layer (HIL) and an electron injection layer (EIL).

In order to allow the organic light emitting diode (OLED) display to serve and act as a flexible display, in addition to using the polymer film as the cover window, a material having predetermined elasticity may be used in negative and positive electrodes and each of the constituent components.

Meanwhile, according to still another exemplary embodiment of the present invention, a rollable display or foldable display device including the polymer film according to the exemplary embodiment may be provided.

The polymer film according to the exemplary embodiment may be used as a substrate, an external protective film, or a cover window of the rollable display device. The polymer film may have elasticity or flexibility to a degree at which the polymer film may not be broken by pressure or force applied from the outside but can be sufficiently warped and folded.

The rollable display device may include the polymer film according to the exemplary embodiment together with a light emitting element and a module in which the light emitting elements are positioned, and the light emitting element and the module may also have elasticity or flexibility to a degree at which they are sufficiently warped and folded.

The rollable display device may have various structures according to an application field, a specific shape, and the like. For example, the rollable display device may have a structure including a cover plastic window, a touch panel, a polarizing plate, a barrier film, a light emitting element (OLED element, or the like), a transparent substrate, or the like.

Advantageous Effect of the Invention

According to the present invention, the polymer film capable of having high elongation or elasticity together with mechanical properties such as excellent scratch resistance, chemical resistance, abrasion resistance, and the like, to thereby be applied to a flexible display, a rollable display device, or the like, the flexible light emitting element display device and rollable display device using the polymer film, may be provided.

Since the polymer film may have sufficient physical properties to replace tempered glass or the like, the flexible display or rollable display device that may not be broken by pressure or force applied from the outside but may be sufficiently warped and folded may be provided.

DETAILED DESCRIPTION OF THE EMBODIMENTS

The present invention will be described in more detail in the following examples. However, the following examples are to illustrate the present invention, and the scope of the present invention is not limited to the following examples.

SYNTHESIS EXAMPLES 1 TO 3

Synthesis of Polyrotaxane

Synthesis Example 1

After 5 g of a caprolactone-grafted polyrotaxane polymer [A1000, Advanced Soft Material Inc.] was put into a 100 ml flask, 0.453 g of 2-isocyanatoethyl acrylate [AOI-VM, Showadenko K.K.], 2 mg of dibutyltin dilaurate [DBTDL, Merck & Co, Inc.], 11 mg of hydroquinone monomethylene ether, and 31.5 g of methylethylketone were added thereto and reacted at 70° C. for 5 hours, thereby obtaining a polyrotaxane polymer liquid including cyclodextrin to which a polylactone-based compound having an acrylate-based compound introduced at the end is bonded as a macrocycle (solid content: 14.79%).

Figure 1:
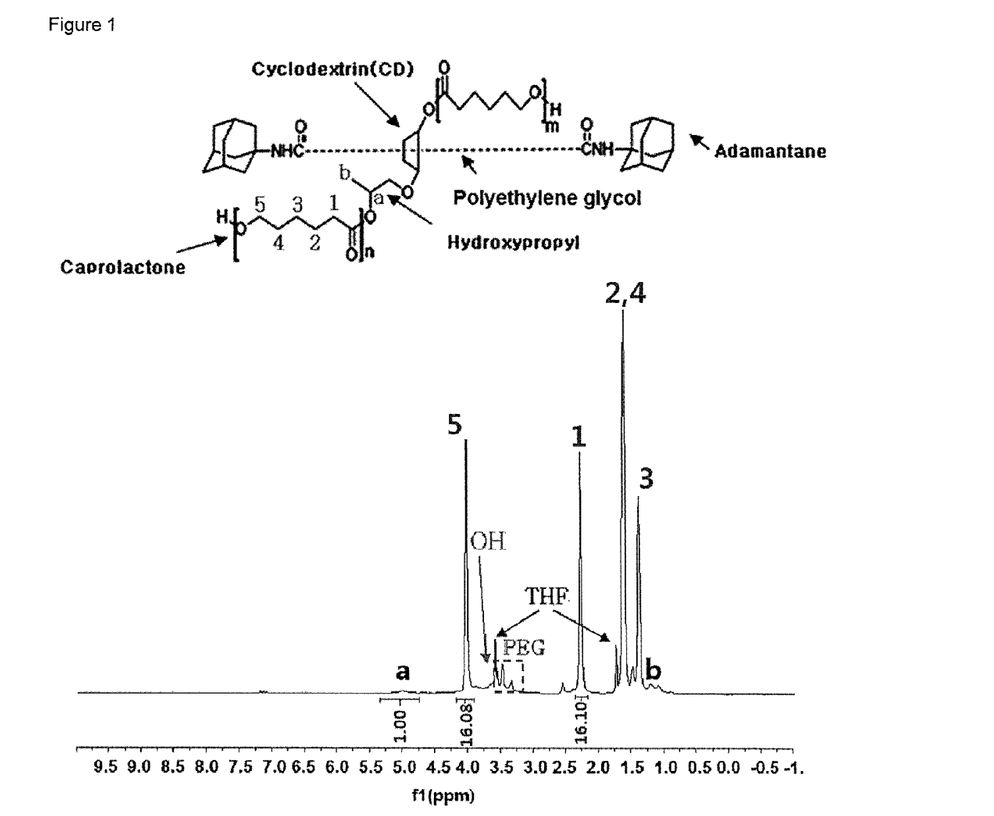
FIG. 1 shows 1H NMR data of a polyrotaxane polymer in Synthesis Example 1.

The polyrotaxane polymer liquid as described above was dripped into an n-hexane solvent to precipitate a polymer, followed by filtration, thereby obtaining a white solid polymer (weight average molecular weight: about 500,000). 1H NMR data of the finally obtained polyrotaxane polymer liquid are shown in FIG. 1.

Figure 2:
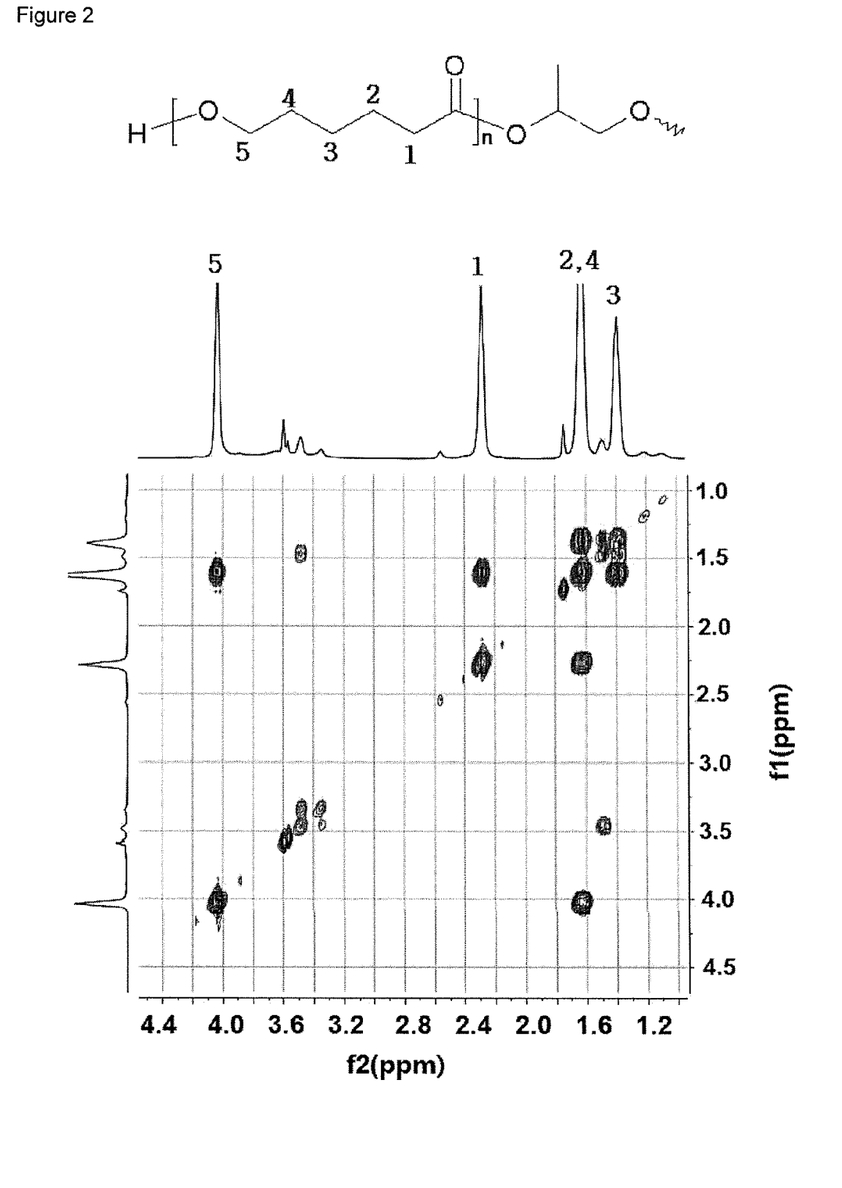
FIG. 2 shows a gCOSY NMR spectrum confirming a structure of caprolactone contained in the polyrotaxane polymer in Synthesis Example 1.

1H NMR data of the polyrotaxane polymer [A1000] that was used in Synthesis Example 1 as a reactant are shown in FIG. 1, and a structure of the caprolactone bonded to the macrocycle of polyrotaxane was confirmed through a gCOSY NMR spectrum of FIG. 2. Further, 1H NMR of polyrotaxane contained in the finally obtained polyrotaxane polymer liquid has a shape as shown in FIG. 3 [a peak intensity, and the like, may be different].

Figure 3:
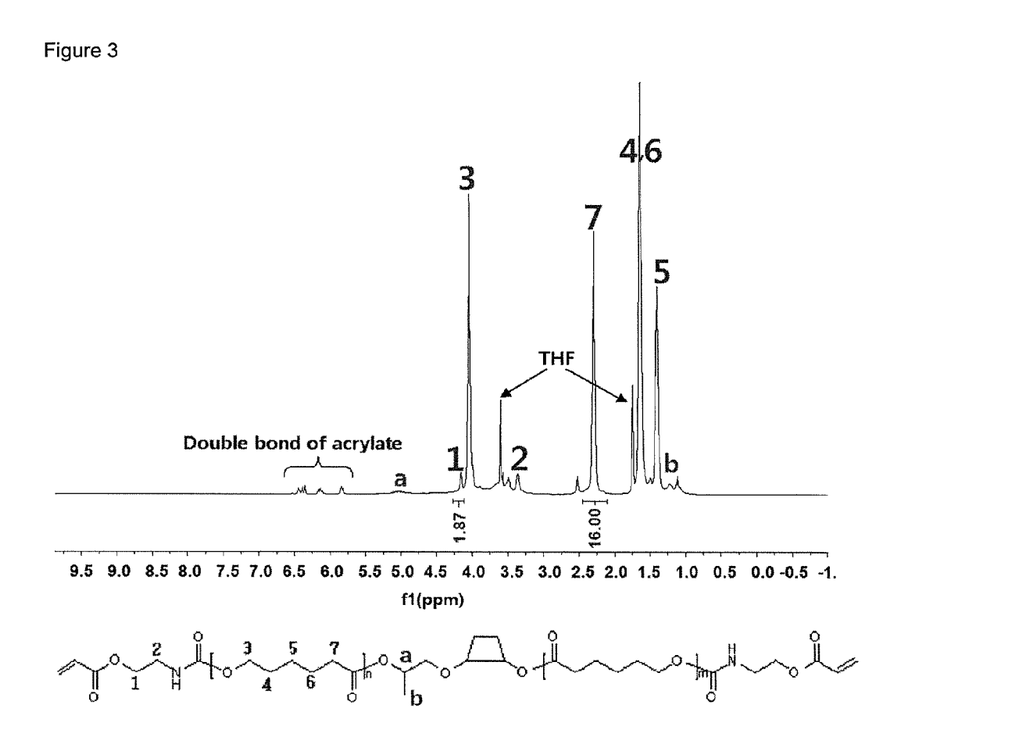
FIG. 3 is an example of 1H NMR date of polyrotaxane including a macrocycle to which a lactone-based compound having a (meth)acrylate-based compound introduced at an end thereof is bonded.

The number (m+N in FIG. 1) of caprolactone repeating units included in the macrocycle of polyrotaxane was confirmed to be 8.05 through the NMR data of FIG. 2, and it may be appreciated that in the case in which the number of repeating units is 8, a seventh peak of FIG. 3 has intensity of 16.00 (2H*8). Therefore, when a substitution rate of the end of the caprolactone repeating unit substituted by "OH" is 100%, a first peak of FIG. 3 relating to acrylate functional groups should have intensity of 4.00 (2H*2). Thus, an end substitution rate of a lactone-based compound bonded to the macrocycle of polyrotaxane may be calculated by comparing with practically measured 1H NMR values. The substitution rate of the finally obtained polyrotaxane polymer liquid (solid content: 15%) was 46.8%.

Synthesis Example 2

After 5 g of a caprolactone-grafted polyrotaxane polymer [A1000, Advanced Soft Material Inc.] was put into a 100 ml flask, 0.906 g of 2-isocyanatoethyl acetate [AOI-VM, Showadenko K.K.], 2 mg of dibutyltin dilaurate [DBTDL, Merck & Co, Inc.], 12 mg of hydroquinone monomethylene ether, and 33 g of methylethylketone were added thereto and reacted at 70° C. for 5 hours, thereby obtaining a polyrotaxane polymer liquid including cyclodextrin to which a polylactone-based compound having an acrylate-based compound introduced at the end is bonded as a macrocycle (solid content: 15.21%).

The polyrotaxane polymer liquid as described above was dripped into an n-hexane solvent to precipitate a polymer, followed by filtration, thereby obtaining a white solid polymer (weight average molecular weight: about 500,000). 1H NMR data of the polyrotaxane polymer [A1000] that was used in Synthesis Example 2 as a reactant are shown in FIG. 1, and a structure of the caprolactone bonded to the macrocycle of polyrotaxane was confirmed through a gCOSY NMR spectrum of FIG. 2.

Further, 1H NMR of polyrotaxane contained in the finally obtained polyrotaxane polymer liquid has a shape as shown in FIG. 3 [a peak intensity and the like may be different]. The number (m+N in FIG. 1) of caprolactone repeating units included in the macrocycle of polyrotaxane was confirmed to be 8.05 through the NMR data of FIG. 2, and it may be appreciated that in the case in which the number of repeating units is 8, a seventh peak of FIG. 3 has intensity of 16.00 (2H*8).

Therefore, when a substitution rate of the end of the caprolactone repeating unit substituted by "OH" is 100%, a first peak of FIG. 3 relating to acrylate functional groups should have intensity of 4.00 (2H*2). Thus, an end substitution rate of a lactone-based compound bonded to the macrocycle of polyrotaxane may be calculated by comparing with practically measured 1H NMR values. The substitution rate of the finally obtained polyrotaxane polymer liquid (solid content: 15%) was 60.0%.

Synthesis Example 3

After 50 g of a caprolactone-grafted polyrotaxane polymer [A1000, Advanced Soft Material Inc.] was put into a reactor, 13.58 g of 2-acryloylethyl isocyanate [Karenz-AOI, Showadenko K.K.], 20 mg of dibutyltin dilaurate [DBTDL, Merck & Co, Inc.], 110 mg of hydroquinone monomethylene ether, and 315 g of methylethylketone were added thereto and reacted at 70° C. for 5 hours, thereby obtaining a polyrotaxane polymer liquid including cyclodextrin to which a polylactone-based compound having an acrylate-based compound introduced at the end is bonded as a macrocycle (solid content: 15%).

It was confirmed by the same method as in Synthesis Examples 1 and 2 that 1H NMR of polyrotaxane contained in the finally obtained polyrotaxane polymer liquid has a shape as shown in FIG. 3 [a peak intensity and the like may be different].

In addition, an end substitution rate of the lactone-based compound bonded to the macrocycle of polyrotaxane was calculated by the same method as in Synthesis Examples 1 and 2, and as a result, the substitution rate of the finally obtained polyrotaxane polymer liquid (solid content: 15%) was close to 100%.

Synthesis Example 4

Synthesis of Silicone-Epoxy Copolymer Having (Meth)acrylate Group Introduced at End After FM-7771 (Chisso Corp. compound of Chemical Formula 10, weight average molecular weight: 1000) and bis-GMA (compound of Chemical Formula 11) were dispersed in a methylethylketone (MEK) solvent, α,α'-azobisisobutylonitrile, which is a thermal initiator, was added thereto, and a polymerization reaction was preformed at 80° C. for 5 hours, thereby synthesizing a silicone-epoxy copolymer having a (meth)acrylate group introduced at an end thereof.

EXAMPLE

Preparation of Polymer Film

Example 1

(1) Preparation of Resin Composition

Based on 100 parts by weight of polyrotaxane obtained in Synthesis Example 1, 15 parts by weight of UA-200PA (multifunctional urethane acrylate, Shin-Nakamura Chemical Co., Ltd.), 40 parts by weight of PU-3400 (multifunctional urethane acrylate, Miwon Corp.), 10 parts by weight of Miramer SIU2400 (multifunctional urethane acrylate, Miwon Corp.), 15 parts by weight of Estane-5778 (polyester-based polyurethane, Lubrizol Corp.), 1.5 parts by weight of Irgacure-184 (photopolymerization initiator), 1.55 parts by weight of Irgacure-907 (photopolymerization initiator), 12.5 parts by weight of isopropyl alcohol (IPA), and 12.5 parts by weight of ethylcellosolve were mixed therein, thereby preparing a UV curable coating composition.

(2) Preparation of Polymer Film

The UV curable coating composition was coated on each PET film (thickness: 188 μm) using a wire bar (No. 70). In addition, the coated product was dried at 90° C. for 2 minutes, and UV rays were irradiated for 5 seconds at 200 mJ/cm$^2$, thereby preparing a polymer film having a thickness of 30 μm.

Example 2

A resin composition and a polymer film were prepared by the same method as in Example 1, except for using the polyrotaxane obtained in Synthesis Example 2.

Comparative Example

A resin composition and a polymer film were prepared by the same method as in Example 1, except for using the polyrotaxane obtained in Synthesis Example 3.

Example 3

(1) Preparation of Resin Composition 60 wt % of the silicone-epoxy copolymer having the (meth) acrylate group introduced at the end thereof (in a state in which it was dispersed in the MEK solvent, solid content: 50 wt %) obtained in Synthesis Example 4, 10 wt % of PETA, 4 wt % of a photoinitiator, 6 wt % of methyl ethyl ketone, and 20 wt % of isopropyl alcohol (IPA) were mixed, thereby preparing a UV curable composition.

(2) Preparation of Polymer Film

The prepared UV curable composition was coated on a PET film using a meyer bar (No. 50), and UV rays having a wavelength of 250 nm to 350 nm were irradiated onto the coated PET film at 200 mJ/cm$^2$, thereby preparing a polymer film.

Experimental Example

Evaluation of Physical Properties of Polymer Film

Physical properties of the polymer films obtained in Examples 1 to 3 and a comparative example were evaluated as follows.

Experimental Example 1

Optical Properties

Light transmittance and haze were measured using a haze meter (Murakami Co. Ltd, HR-10).

Experimental Example 2

Elongation

A tensile strain (%) was measured by a tensile stress-strain test method specified in ASTMD638. In detail, a tensile specimen was manufactured according to ASTM D638 Standard, and the specimen was elongated using a texture analyzer (TA) at a predetermined rate (1 cm/s), thereby determining elongation (%) from a ratio of a length of the elongated specimen to a length of the initial specimen.

Experimental Example 3

Measurement of Scratch Resistance

A constant load was applied to steel wool to cause scratches while moving it back and forth, and the surface of the coating film was then observed with the naked eye.

The measurement results are shown in the following Table 1.

TABLE 1

|  | Example 1 | Example 2 |
|---|---|---|
| Transmittance/Haze | 92.9/0.7 | 92.6/0.8 |
| Elongation | 150% | 15% |
| Scratch Resistance | 300 g load OK | 200 g load OK |

As shown in Table 1, the polymer coating films in Examples 1 and 2 may have high elongation and elasticity while having transparent appearance characteristics, and have mechanical properties such as excellent scratch resistance or the like. Therefore, since the polymer film may have sufficient physical properties to replace tempered glass or the like, the polymer film may be used as a substrate, an external protective film, or a cover window in a flexible light emitting element display device.

4. Mandrel Test

After the coating films obtained in the examples and the comparative example were wound 180° around cylindrical mandrels having different thicknesses, respectively, and maintained for 1 second, crack generation was observed with the naked eye, and a time when cracks are not generated was confirmed while lowering an φ value of the cylindrical mandrels.

TABLE 2

|  | Example 1 | Example 2 | Comparative Example |
|---|---|---|---|
| Mandrel Test (Φ) | 4 | 6 | 24 |

As a result, it was confirmed that in the coating films prepared in Examples 1 and 2, cracks were not generated with a cylindrical mandrel having a lower φ value, such that the coating film had higher elasticity or elongation, high flexibility, and a foldable or rollable property as compared to the comparative example.

What is claimed is:

1. A polymer film comprising:
   a binder resin having a weight average molecular weight of 30,000 to 800,000; and
   a polyrotaxane including a macrocycle to which a lactone-based compound is bonded, a linear molecule penetrating into the macrocycle, and a blocking group arranged at both ends of the linear molecule to prevent the macrocycle from being separated,
   wherein a rate of a polyrotaxane in which an end of the lactone-based compound is substituted by a (meth)acrylate-based compound in the entire polyrotaxane is 40 mol % to 70 mol %, and
   the polymer film is bent over a mandrel having a diameter of 10 mm or less without cracking in a mandrel test.

2. The polymer film of claim 1, wherein
   the polymer film has sufficient flexibility to be bent over a cylindrical steel mandrel having a diameter of 7.0 mm or less without cracking at the time of performing measurement according to ASTM Standard D522-93A method B.

3. The polymer film of claim 1, wherein
   the polymer film has a thickness of 5 μm to 100 μm.

4. The polymer film of claim 1, wherein
   elongation measured according to ASTM D638 at room temperature is 5% to 500%.

5. The polymer film of claim 1, wherein
   the polymer film has light transmittance of 92.0% or more and haze of 0.9 or less.

6. The polymer film of claim 1, wherein
   the polymer film is used as a substrate, an external protective film, or a cover window of a light emitting element display device.

7. The polymer film of claim 1, wherein
   the polymer film has a glass transition temperature of −80° C. to 100° C.

8. The polymer film of claim 1, wherein
   the binder resin includes at least one selected from a group consisting of a (meth)acrylate-based polymer, a urethane (meth)acrylate-based polymer, a polyurethane resin, and a silicone-epoxy copolymer having a (meth)acrylate group introduced at an end thereof.

9. The polymer film of claim 1, wherein
   the macrocycle includes at least one selected from a group consisting of α-cyclodextrin, β-cyclodextrin, and γ-cyclodextrin.

10. The polymer film of claim 1, wherein
    the lactone-based compound is directly bonded to the macrocycle or bonded to the macrocycle via a straight or branched oxyalkylene group having 1 to 10 carbon atoms.

11. The polymer film of claim 1, wherein
    a residue of the lactone-based compound includes a functional group of the following Chemical Formula 1:

[Chemical Formula 1]

wherein, in Chemical Formula 1, m is an integer of 2 to 11, and n is an integer of 1 to 20.

12. The polymer film of claim 1, wherein
    the (meth)acrylate-based compound is directly bonded to the end of the lactone-based compound or bonded to the end of the lactone-based compound via a urethane bond, an ether bond, a thioester bond, or an ester bond.

13. The polymer film of claim 1, wherein
a residue of the (meth)acrylate-based compound bonded to the end of the lactone-based compound includes a functional group of the following Chemical Formula 2:

[Chemical Formula 2]

wherein, in Chemical Formula 2, $R_1$ is hydrogen or methyl, and $R_2$ is a straight or branched alkylene group having 1 to 12 carbon atoms, a cycloalkylene group having a 4 to 20 carbon atoms, or an arylene group having 6 to 20 carbon atoms, and

* means a binding site.

14. The polymer film of claim 1, wherein
the linear molecule is a polyoxyalkylene-based compound or a polylactone-based compound.

15. The polymer film of claim 1, wherein
the linear molecule has a weight average molecular weight of 1000 to 50,000.

16. The polymer film of claim 1, wherein
the blocking group includes at least one functional group selected from a group consisting of a dinitrophenyl group, a cyclodextrin group, an adamantane group, a trityl group, a fluorescein group, and a pyrene group.

17. The polymer film of claim 1, wherein
the polyrotaxane has a weight average molecular weight of 100,000 to 800,000.

18. The polymer film of claim 1, wherein
the polymer film contains the polyrotaxane at a content of 1 wt % to 50 wt % based on the entire weight of the polymer film.

19. The polymer film of claim 1, wherein
the polymer film has a crosslinked structure between the binder resin and the polyrotaxane.

20. The polymer film of claim 1, wherein
the polymer film contains a multifunctional acrylate-based compound forming a crosslink bond with at least one of the binder resin and the polyrotaxane.

21. A flexible light emitting element display device comprising the polymer film of claim 1.

22. The flexible light emitting element display device of claim 21, wherein the flexible light emitting element display device includes the polymer film as a substrate, an external protective film, or a cover window.

23. The flexible light emitting element display device of claim 21, wherein the flexible light emitting element display device includes a cathode providing electrons, an electron transport layer, an emission layer, a hole transport layer, and an anode providing holes, and
the polymer film is bonded to at least one surface of the cathode or the anode.

24. A rollable display device comprising the polymer film of claim 1.

25. The rollable display device of claim 24, wherein the rollable display device includes the polymer film as a substrate, an external protective film, or a cover window.

* * * * *